United States Patent
Reiter

(10) Patent No.: US 10,160,145 B2
(45) Date of Patent: Dec. 25, 2018

(54) MICROFLUIDIC DEVICE

(71) Applicant: STRATEC Consumables GmbH, Anif (AT)

(72) Inventor: Gottfried Reiter, Adnet (DE)

(73) Assignee: STRATEC CONSUMABLES GMBH, Anif (AT)

( * ) Notice: Subject to any disclaimer, the term of this patent is extended or adjusted under 35 U.S.C. 154(b) by 964 days.

(21) Appl. No.: 14/333,686

(22) Filed: Jul. 17, 2014

(65) Prior Publication Data

US 2015/0061189 A1 Mar. 5, 2015

(30) Foreign Application Priority Data

Sep. 3, 2013 (EP) ..................................... 13182851

(51) Int. Cl.
*B29C 45/14* (2006.01)
*B29C 45/00* (2006.01)
(Continued)

(52) U.S. Cl.
CPC .... *B29C 45/0025* (2013.01); *B01L 3/502707* (2013.01); *B81C 1/00119* (2013.01); *B29C 33/38* (2013.01); *B29C 45/372* (2013.01); *B29C 45/401* (2013.01); *B29C 65/02* (2013.01); *B29C 65/4895* (2013.01); *B29C 65/72* (2013.01); *B29C 66/1122* (2013.01); *B29C 66/53461* (2013.01); *B29C 2045/0094* (2013.01); *B29K 2101/12* (2013.01); *B29K 2995/0018* (2013.01); *B29L 2031/756* (2013.01); *B81B 2201/058* (2013.01); *B81C 2203/036* (2013.01); *B81C 2203/054* (2013.01)

(58) Field of Classification Search
CPC .... B29C 2045/0094; B29C 2045/0034; B29C 2045/0036; B29C 2045/14991
See application file for complete search history.

(56) References Cited

U.S. PATENT DOCUMENTS 5,885,470 A * 3/1999 Parce .................. B01J 19/0093
204/450
7,195,733 B2 * 3/2007 Rogers .................. B82Y 10/00
264/496
(Continued)

FOREIGN PATENT DOCUMENTS

JP 05092450 A * 4/1993 ............. B29C 45/40
JP 2625885 7/1997
(Continued)

OTHER PUBLICATIONS

Song, Zhichao, "Study of demolding process in thermal imprint lithography via numerical simulation and experimental approaches," (2007). LSU Master's Theses. 2965.*

(Continued)

*Primary Examiner* — William P Bell
*Assistant Examiner* — Andrew L Swanson
(74) *Attorney, Agent, or Firm* — 24IP Law Group; Timothy R DeWitt

(57) ABSTRACT

A method of manufacturing a microfluidic device comprises molding a substrate using a master die having at least one outer stepped formation; and forming at least one microstructured formation having an outer rim, the depth of the outer rim being shallower than that of the microstructured formation.

8 Claims, 8 Drawing Sheets

(51) Int. Cl.
*B01L 3/00* (2006.01)
*B81C 1/00* (2006.01)
*B29C 45/40* (2006.01)
*B29K 101/12* (2006.01)
*B29C 65/48* (2006.01)
*B29C 65/72* (2006.01)
*B29C 45/37* (2006.01)
*B29C 65/00* (2006.01)
*B29C 33/38* (2006.01)
*B29L 31/00* (2006.01)
*B29C 65/02* (2006.01)

(56) References Cited

U.S. PATENT DOCUMENTS

| 7,396,475 | B2 * | 7/2008 | Sreenivasan | B81C 1/0046 |
| | | | | 216/11 |
| 2008/0231940 | A1 | 9/2008 | Imanishi | |
| 2012/0164262 | A1 * | 6/2012 | Qin | B29C 33/0033 |
| | | | | 425/468 |

FOREIGN PATENT DOCUMENTS

| JP | 2005-219465 | 8/2005 |
| JP | 2007-075888 | 3/2007 |
| JP | 2008-142919 | 6/2008 |
| JP | 2008-168298 | 7/2008 |
| JP | 4138370 | 8/2008 |
| JP | 4274251 | 6/2009 |

OTHER PUBLICATIONS

Turner, Ryan, "Tapered LIGA Mold Insert," 2002, LSU Master's Thesis.*

Mair, Injection Molded Microfluidic Chips Featuring Integrated Interconnects, Jul. 31, 2006, The Royal Society of Chemistry, 1346-1354 and specifically Fig. 5 on p. 1351 (Year: 2006).*

Giuliano Bissacco, et al., "Precision manufacturing methods of inserts for injection molding of microfluidic systems", ASPE Spring Topical Meeting on Precision Macro/Nano Scale Polymer Based Component & Device Fabrication, ASME, 2005, 7 pages.

Usama M. Attia, et al., "Micro-Injection Moulding of Polymer Microfluidic Devices", Microfluidics and Nanofluidics, vol. 7, No. 1, Jul. 2009, pp. 1-30.

Chia-Wen Tsao, et al., "Bonding of thermoplastic polymer microfluidics", Microfluid Nanofluid, vol. 6, 2009, pp. 1-16.

Jorge A. Ruiz-Cruz, et al., "Multi-Section Bow-Tie Steps for Full-Band Waveguide Polarization Rotation", IEEE Microwave and Wireless Components Letters, vol. 20, No. 7, Jul. 2010, pp. 375-377.

* cited by examiner

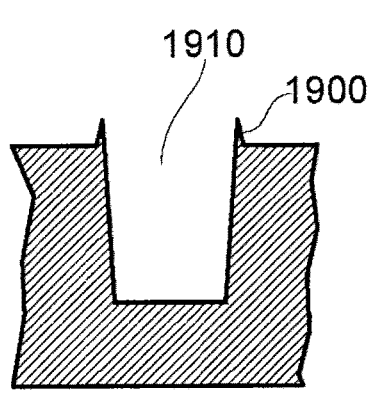 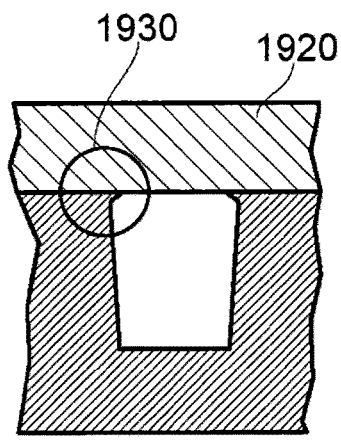
FIG. 15A　　　　　　　FIG. 15B
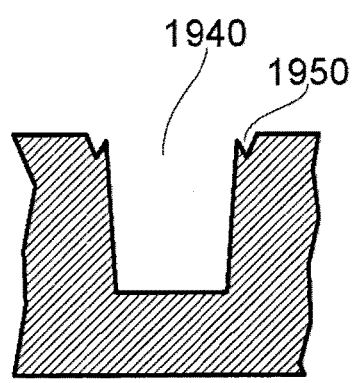 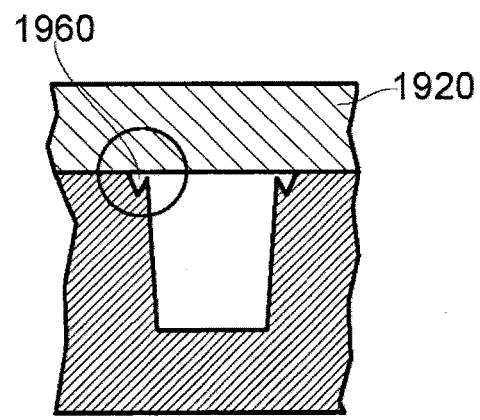
FIG. 16A　　　　　　　FIG. 16B
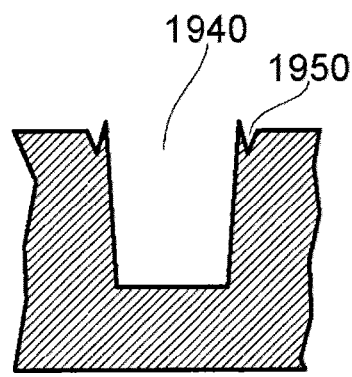 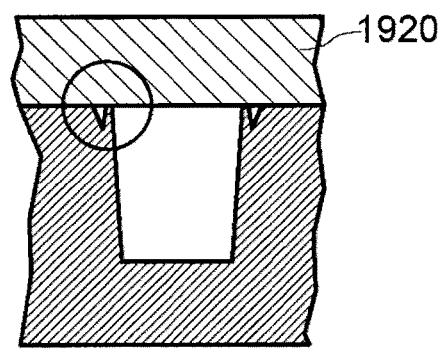
FIG. 17A　　　　　　　FIG. 17B

MICROFLUIDIC DEVICE

BACKGROUND

Field

The present disclosure relates to microfluidic devices and methods of manufacture and inspection of such devices.

Description of Related Art

The background description provided here is for the purpose of generally presenting the context of the disclosure. Work of the presently named inventors, to the extent that it is described in the background section, as well as aspects of the description which may not otherwise qualify as prior art at the time of filing, are neither expressly nor implicitly admitted as prior art against the present disclosure.

Microfluidic circuits are typically manufactured as planar structures from two substrates which are bonded together and arranged in a carrier. The carrier is sometimes referred to as a caddy. In the case of polymer substrates, thermal bonding and solvent vapour bonding are example bonding methods. In particular, thermal bonding has advantages for biological applications in that no contaminants are involved, for example in comparison to adhesive bonding. Microfluidic circuit elements, such as channels and mixing chambers, are formed at the interface between the substrates by surface structures in one or both of the substrates.

So, in some arrangements, a closed structure can be created by forming a channel, well or similar open formation in one part or substrate, and bonding a second part (such as another substrate, a rigid polymer part or a thin foil) to cover or close the open formation.

Thermal bonding and solvent vapour bonding rely on first softening one or both of the polymer surfaces to be bonded and then pressing the two surfaces together to induce some deformation. In the case of bonding to cover or close an open formation, the bonding of course takes place around the periphery of the open formation.

At this peripheral region around the functional structures, in an ideal case the surfaces at which bonding is to take place are flat, in order to obtain an even bond. Deviations from flatness can be caused by moulding or formation errors (leading to waviness or unevenness of the surfaces) of burrs (raised edges formed around areas which have been moulded or machined). If such deviations are present, they can interfere with the bonding process, and so interfere with the integrity of the finished article, and in particular can affect the integrity of the closed structure—and in some cases, can cause the closed structure to leak.

Due to the shrinkage of the polymer material (when the material cools down after moulding) burrs can be created even if there is a draft angle (that is, even if the formations are chamfered). The height of such burrs depend on, for example, the height of the structures, the draft angle of the structures, the precision of the moulding tool and other aspects of the processing conditions. In general terms, besides causing functional problems arising from the structural deformation, burrs can also cause problems during bonding, for example in thermal bonding or solvent assisted bonding.

SUMMARY

According to a first aspect of the present disclosure, there is provided a method of manufacturing a microfluidic device, the method comprising: moulding a substrate using a master die having at least one outer stepped formation; and forming at least one microstructured formation having an outer rim, the depth of the outer rim being shallower than that of the microstructured formation.

Further respective aspects and features are defined by the appended claims.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIGS. 15a, 15b, 16a, 16b, 17a and 17b schematically illustrate the effect of burrs on the bonding process.

DETAILED DESCRIPTION

Figure 1:
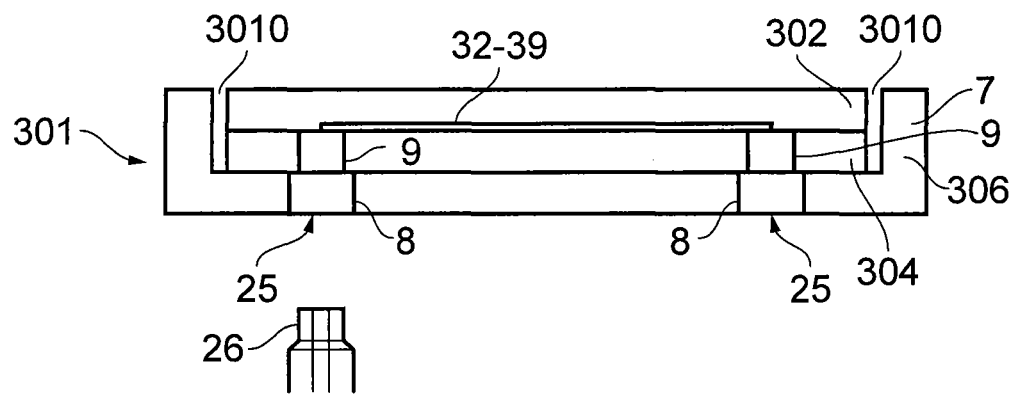
FIG. 1 is a schematic cross-section of a microfluidic device.
Figure 2:
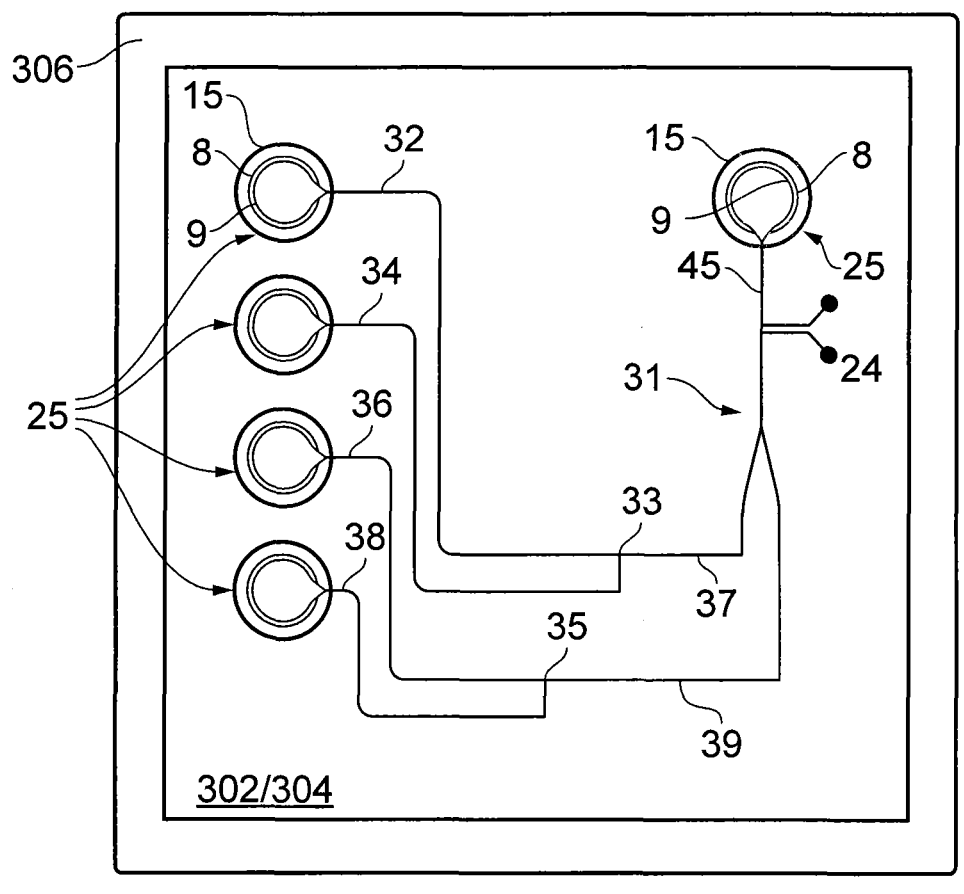
FIG. 2 is a schematic plan view of the microfluidic device of FIG. 1.
Figure 3:
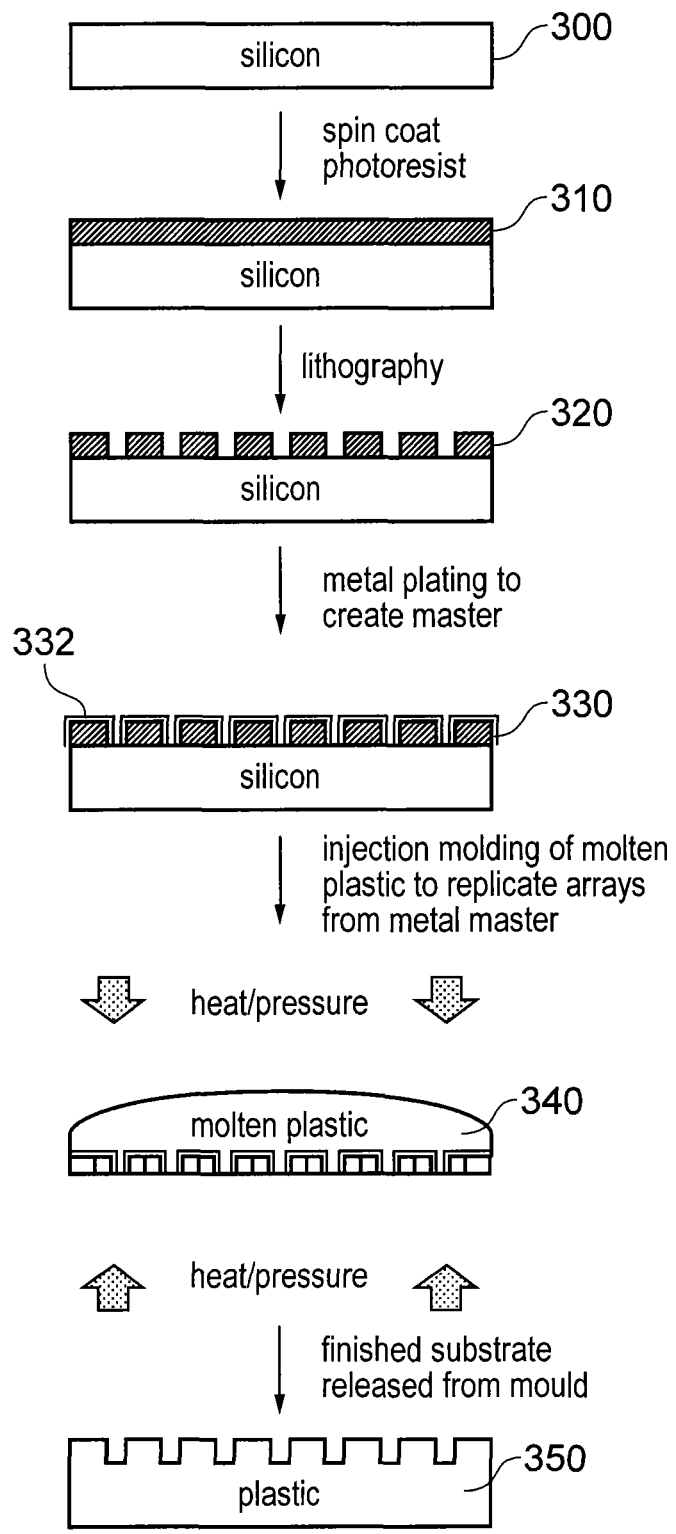
FIG. 3 is a schematic flowchart illustrating steps in the production of a substrate.

Referring now to the drawings, wherein like reference numerals designate identical or corresponding parts throughout the several views, FIGS. 1 to 3 are provided to illustrate a problem which is addressed by embodiments of the present technique.

A microfluidic device is formed of one or more substrates, for example of a polymer material. In a typical device in which multiple substrates or layers are bonded together, the polymer materials for the different layers may be the same or different, though in embodiments of the present disclosure the two materials are of the same "class" such as COP (defined below). In embodiments of the disclosure, the two materials used for a pair of bonded layers are identical.

Suitable base polymers for the substrate(s) include: polystyrene (PS), polyethylene (PE), cycloolefin polymer (COP), cycloolefin co-polymer (COC), styrene-acrylonitrile copolymer (SAN), polyamide (nylon), polycarbonate (PC), and polymethyl methacrylate (PMMA). Specific example plastics compounds are as follows. PS: BASF '158K' which is a high heat, clear material suitable for injection moulding; COP: Zeon Chemicals 'Zeonor 1060R' which is a clear, low water absorption material suitable for injection moulding; PMMA: Asahi Kasei 'Delpet 70NH' which is transparent and suitable for injection moulding; and HM671T 'PC Bayer MaterialScience AG 'Makrolon 2458' which is a medical grade, clear material suitable for injection moulding.

The bonding process between the substrates may be thermal bonding, in which case the softening is by heating.

Alternatively, the process may be solvent vapour bonding, wherein softening is caused by exposure of one or both of the surfaces to a solvent vapour. Of course, solvent vapour bonding may also be associated with some heating (for example, to an elevated temperature which is below the glass transition temperature Tg of the material). There are also other softening techniques which may be used, instead of or in addition to the techniques already described. These include one or more of: plasma activation, ultraviolet activation, liquid solvent activation. All of these techniques can be considered to serve the same purpose: softening at least the surface of the material (possibly to a depth of just a few μm), for example by reducing the glass transition temperature Tg of the material. Other methods of softening may also (or instead) be used.

A particular example device and its fabrication will now be described in order to illustrate aspects of the present techniques.

FIG. 1 is a schematic cross-section of an example microfluidic device 301, and FIG. 2 is a schematic plan view of the microfluidic device of FIG. 2.

The device of FIGS. 1 and 2 receives input fluids via (in this example) so-called Luer connectors (in particular, so-called Luer-slip type connectors are used in this example), and provides an output fluid after various fluid processing actions have been performed, again by means of a Luer connector.

The choice of processing actions to be carried out by the device is a decision for the skilled person during a design phase, and is not directly relevant to the present techniques described here. Example processing actions include selective mixing, coalescing, testing, heating, cooling, illumination or other processing actions carried out on the liquids. A subset of these processing actions is illustrated in the example of FIGS. 1 and 2.

Substrate layers 302, 304, 306 are provided, with the substrate layer 306 being shaped so as to form side walls 7 around the device. The substrate layers are bonded together as described above.

A male Luer connector 26 is shaped and dimensioned to engage into a female Luer connector 25 formed by holes 8 and 9.

The third layer 306 is part of a carrier or caddy accommodating the microfluidic circuit formed by the bonded first and second layers 302 and 304. As mentioned, the carrier has side walls 7 which wrap around the edges of the first and second layers 302 and 304. A thermal expansion gap 3010 may be provided at the lateral edges of the substrate layers 302, 304, where thermal bonding is used between the substrate layer 304 and 306. In other arrangements, the carrier may be implemented using a laser absorbing material, using laser welding to combine the carrier 306 with the substrate layer 304.

A highly schematic microfluidic circuit is depicted, consisting of four female Luer connectors 25 as inlet ports, from which extend channels 32, 34, 36 and 38. Channels 32 and 34 join at a T-shaped droplet generator 33, and channels 36 and 38 join at a T-shaped droplet generator 35, the two merged channels 37 and 39 then in turn combining at a connection-shaped droplet generator 31 into a channel 45. An electrode portion 24 is also shown adjacent the channel 45 and serves, for example, to coalesce droplets of analyte and sample liquid passing along the channel. The channel 45 terminates in an outlet Luer port 25 with laser weld 20. It will be appreciated that in some implementations some of the inlet/outlet ports may be sealed with O-rings (or other gasket types) and others with continuous seam welds.

It will be understood that the bonding of at least the substrate 302 to the substrate 304, by which the holes 9 are closed, may be carried out using techniques as described here. The substrate 302 may be replaced by a different type of closure member such as a foil, as discussed above. Bonding of other bonded pairs of substrates, whether or not the bond results in the complete sealing of an open formation, may be carried out using these techniques.

The way in which the various features of the individual substrate layers are formed will now be described with reference to FIG. 3.

FIG. 3 is a schematic flowchart illustrating steps in the production of a substrate using injection moulding.

In particular, the steps of FIG. 3, when read in conjunction with the other drawings, provide an example of a method of manufacturing a microfluidic device, the method comprising: moulding a substrate using a master die so that a surface of the substrate includes one or more microstructured formations complementary to respective moulding formations on the die, the fluid-carrying formations forming at least part of a microfluidic channel network comprising a plurality of microfluidic channels, in which one or more of the moulding formations on the master die comprise outer stepped formations (see FIGS. 4 and 5, for example) so that the respective complementary microstructured formations on the substrate include an outer rim shallower than the microstructured formation, the rim not being in the plane of the substrate. They also provides an example of a method of manufacturing a microfluidic device, the method comprising: moulding a substrate using a master die having at least one outer stepped formation; and forming at least one microstructured formation having an outer rim, the depth of the outer rim being shallower than that of the microstructured formation. In some embodiments the moulding step comprises moulding the substrate using a master die so that a surface of the substrate includes one or more microstructured formations complementary to respective moulding formations on the die, the microstructured formations including a microfluidic channel and forming at least part of a microfluidic channel network comprising a plurality of microfluidic channels, in which one or more of the moulding formations on the master die comprise the outer stepped formation so that the respective complementary microstructured formations on the substrate include the outer rim shallower than the microstructured formation, the rim not being in the plane of the substrate.

It will be appreciated that microstructured formations can include various types of fluid-carrying or other formations, such as channels, wells, crossings and the like. Techniques described here in respect of channels can apply to other microstructured formations.

The steps of FIG. 3, when read in conjunction with the other drawings, also provide an example of a method of manufacturing a microfluidic device, the method comprising: moulding a substrate using a master die so that a surface of the substrate includes one or more microstructured formations complementary to respective moulding formations on the die, the microstructured formations forming at least part of a microfluidic channel network comprising a plurality of microfluidic channels, in which the master die comprises one or more anchor formations (see FIGS. 8 to 10) having a greater height or depth than the maximum height or depth of the one or more moulding formations.

The first part of the process is to manufacture a master or die. This is because the basis of the technique is to mould a substrate using a master die so that a surface of the substrate includes one or more fluid-carrying formations complementary to respective moulding formations on the die, the fluid-carrying formations forming at least part of a microfluidic channel network comprising a plurality of microfluidic channels, A silicon or glass wafer 300 is spin coated with a photoresist 310. A laser or other suitable light source is then used to expose the photoresist to define a structure with high spatial resolution. The material to be exposed is transparent to the laser light used. However, in the focal volume of this highly focused laser beam a chemical or physical modification is created. Ultimately a selective solubility of the exposed area relative to the surrounding is achieved. In a developer bath, depending on the photosensitive material which is used, either the exposed or unexposed areas are removed. In other words, if the photoresist is such that exposure to the laser light leaves or renders it insoluble, and leaves or renders the unexposed material soluble, then the unexposed material is removed in the developer bath. For other photoresist materials the opposite could apply so that the developer bath removes the exposed material. Thus, almost any "2.5D" structures from a variety of photosensitive materials can be realized (for example SU-8 or the positive photoresist AZ9260 from AZ Electronic Materials are examples of suitable types of photoresist). Note that the expression "2.5D" is notation to indicate a three-dimensional structure which is limited by the fact that undercut formations cannot be implemented by this technique, but embodiments are also applicable to 3D structures more generally.

Alternative technologies for structuring the resist master are direct laser micromachining, e-beam lithography or mask based lithography processes. Laser write lithography can also be used with inorganic phase transition materials instead of the photoresist pushing the size resolution limit below the wavelength of the laser. Once the photoresist has been suitably structured and the exposed (or non-exposed, as the case may be) material removed to form a structured photoresist 320, a metal plating processing step is applied. Electroplating is used to deposit a nickel layer by electrolysis of nickel salt-containing aqueous solutions, so-called nickel electrolytes. Nickel electrolytes usually have nickel or nickel pellets as the anode. They serve the supply of metal ions. The process for the deposition of nickel has long been known and been highly optimized. Most nickel electrolytes to achieve an efficiency of >98%, which means that over 98% of the current supplied to be used for metal deposition. The remaining power is lost in unwanted electrolytic processes, such as hydrogen. The transcription of lithographically structured micro-features is strongly dependent on compliance with the correct parameters. Not only the continuous supply of additives, but also the metal ion content, the temperature and the pH value need to be maintained.

The result is a metal coated version 330 (having a metal coating 332) of the structure defined by the partially removed photoresist.

Direct milling into steel can be used as an alternative to silicon and photoresist in order to master such microstructures. Other methods, or other variations on the methods described above, are also possible, as described in the documents referenced below.

Basically a moulding tool called a mould or die consists of two halves/plates At the parting surface a cavity defines the shape of the final polymer part. The cavity may reach into only one plate or into both plates. For injection moulding of microfluidic polymer parts so called masters created by various technologies are used within the plates to define the microstructures. The steps 300 to 330 refer to the formation of one of those masters, which in the present example is a master which carries microstructures arranged so as to define complementary microstructures on the moulded part. The polymer melt enters the cavity through a gate at the end of a sprue or runner system in the mould.

The master die (referred to simply as the "master" below) is then used in an injection moulding process to create the structured surfaces in polymer to incorporate the structuring needed for the microfluidic channel network.

During an injection moulding cycle usually the injection mould can be kept at a certain mould temperature (referred to as isothermal moulding). For other special applications, the temperature of the mould or only the surfaces of the cavity and/or the master can instead be varied during the moulding cycle for instance to improve the replication of the structures (variothermal moulding).

After closing the mould the polymer melt is injected into the cavity of at a high temperature, high pressure and high speed. For instance for COP 1060R which has a glass transition temperature Tg of about 100° C. the mould temperature which defines the temperature of the walls of the cavity is usually about 70° C. to 95° C., the injection temperature is about 210° C., the injection pressure is about 500-1500 kgf/cm$^2$ and the injection speed is about 30-80 cm$^3$/s.

After filling of the cavity a holding pressure is applied with the aim to compensate for the material shrinkage at the expense of freezing residual stress. The material solidifies into the final shape as the material temperature decreases below the glass transition temperature of the material by cooling of the mould. The mould can be opened and the polymer part can be de-moulded and ejected/removed from the mould (including the microstructures). Then the injection cycle can be repeated.

As discussed, in an injection moulding machine, polymers (shown generically as molten plastic 340 in FIG. 6) are plasticized in an injection unit and injected into a mould. The cavity of the mould determines the shape and surface texture of the finished part. The polymer materials need to be treated carefully to prevent oxidation or decomposition as a result of heat or sheer stresses. Heat and pressure are applied to press molten polymer onto the structured surface of the master. Depending on the polymer, the thickness of the part and complexity of the structures the cycle time can be a few seconds (e.g. for isothermal moulding of optical discs) up to several minutes (for example for variothermal moulding of thick parts with high aspect ratio microstructures). After a suitable filling, cooling and hardening time (noting that cooling and hardening take place together for thermoplastics), the heat and pressure are removed and the finished plastics structure 350 is ejected from the mould. The injection moulding process can then be repeated using the same master.

The cost of the master and the larger moulding tool it will form a part of represents a large part of the total necessary investment, so the process lends itself to high volumes. Simple tools enable economic viable prototyping from a threshold of a few thousand parts. Tools for production can be used up to make up to several million parts.

The injection moulded substrate can be further plasma treated to control the surfaces properties, for example to alter the glass transition temperature Tg or to change the surface tension (or contact angle, respectively).

Moreover, a coating can be applied to a whole surface or selectively applied to only some areas as desired. For example, sputtering, ink jet printing, spotting or aerosol jetting may be used to deposit a coating.

Finally, it is noted that the carrier may not include features requiring precision on the same small size scale as the layers which are used to form the planar microfluidic circuit elements. It will therefore be possible in some cases to manufacture the carrier using simpler or alternative methods.

Beside the general functional problems discussed above caused by structure deformation or deviation, burrs can cause particular problems during bonding by (for example) thermal bonding or solvent assisted bonding.

As mentioned above a holding pressure is applied with the aim to compensate for the material shrinkage. The polymer melt is compressed during cooling and so stress is frozen in the polymer material. This is only possible as long as the polymer is in liquid phase. When the polymer solidifies in the gate area the holding pressure has no influence on shrinkage any more.

This stress can cause warping of the final part because the shrinkage can vary within the part depending on part geometry and process parameters.

One of the most difficult steps is the de-moulding of the microstructures. The microstructures may be deformed, protracted or torn away and/or burrs may be created. If the de-moulding force is varying across the surface the final part may be warped during de-moulding.

There are multiple parameters which affect the demoulding of the microstructures.

a) stress frozen in the polymer material during cooling of the material (caused by different shrinkage of the mould or master and the polymer). Although holding pressure can compensate for some material shrinkage stress is frozen in the polymer material. This stress is directed towards the "centre of shrinkage". This is more or less the geometrical centre of the part. The stress increases with the distance to the "centre of shrinkage". Such stress results in shear force can cause defects/burrs at the microstructures. At elevated structures like pillars these defects/burrs are directed towards the "centre of shrinkage" and in worst case structures are sheared off. At recessed structures like channels these defects/burrs are directed away from the "centre of shrinkage". The height/intensity of these defects/burrs is depending on the distance to the "centre of shrinkage", basically. The nature of the centre of shrinkage will be discussed further with reference to FIGS. 11 and 12 below.

b) friction force caused by sidewall roughness and surface adhesion between mould or master and polymer. Sidewall roughness may come from the manufacturing process of the mould/master. For instance if micro-milling is used the machining parameters and surface condition of the end-mill influence the surface quality. If silicon DRIE (dry reactive ion etching) is used the process parameters influence the frequency and height of the ripples of the sidewalls. The surface adhesion between mould and polymer may be minimized with proper material selection, by use of surface coatings or by adding release agents into the polymer. High surface adhesion can cause protracted or torn away structures and burrs.

A "positive draft angle" can support the de-moulding. "Positive draft angle" means that a recessed structure such as a channel is wider at the surface/becomes narrower to the base or an elevated structure such as a pillar is wider at the base and becomes narrower at the top.

A "negative draft angle" will cause "undercut structures" which get stuck in the mould/master and can be torn away or protracted.

Depending on the type of structure, sidewall roughness, polymer and injection parameters structures without draft angle can be de-moulded but some deformations are expected.

Accordingly, due to the shrinkage of the polymer material (when the material cools down after moulding) burrs are created even if there is a draft angle (that is to say, even if the relevant structural features of the master have chamfered or sloping sides, rather than sides which are perpendicular to the plane of the substrate). The height of such burrs depends on (for example) the height of the structures, the draft angle of the structures, the precision of the moulding tool and other aspects such as the processing conditions.

Beside functional problems caused by this structure deformation burrs can cause problems during bonding by e.g. thermal bonding, solvent assisted bonding.

In embodiments of the present technique, a step formation can be added at the "top" of the structures to hide or otherwise reduce the effect of the burrs. The height of the step can be selected to be smaller or larger than the expected height of the burrs. Here, the word "top" signifies the end of the formation which is nearest to the plane of the surface of the substrate in which the structural features are being formed. It does not imply any orientation of the substrate or a resulting device either during fabrication or in use. For example, one or more moulding formations on the master die can comprise outer stepped formations so that the respective complementary fluid-carrying formations on the substrate include an outer rim shallower than the fluid-carrying formation but below the surface of the substrate. Further discussion of the effect of burrs will be provided with respect to FIGS. 15a, 15b, 16a, 16b, 17a and 17b below, noting that for some fluidic applications the trapping of air at the edges of the channels can be a problem, so that the depth of the step would then be selected to be smaller than the height of a typical burr (as described with reference to FIGS. 17a and 17b below) so as to avoid the effect described below with respect to FIG. 16b below in which a hollow space in fluid communication with the channel might be formed behind the burr.

In other embodiments, so-called "anchor structures" can be included which absorb some, most or all of the lateral shear force caused by the shrinkage of the polymer can be provided, so as to reduce lateral forces at the microstructures. Such anchor structures can be located between microstructures and/or around the micro-structured area.

The purpose of the anchor structures is to "move away" the shear stress from the microstructures and "concentrate" the shear stress to these anchor structures. Using such anchor structures the lateral/relative movement between the mould/master and the polymer part can be minimized or at least mitigated during demoulding of the microstructures.

Most of the shear stress will be released during demoulding causing a lateral movement of the polymer part relative to the master. This movement is directed to the "centre of shrinkage" referred to above and may cause a deformation of the microstructures. If this lateral movement is minimized/stopped during demoulding of the microstructures the deformation can be minimized. In order that the microstructures will be demoulded before the anchor structures the anchor structures should be more deep (for recessed microstructures) or taller (for elevated microstructures) than the microstructures. Since there is high stress on the anchor structures there will be some deformation of the polymer part around these anchor structures like high burrs which can "hidden" as discussed above.

The depth/height of these anchor structures should, in at least some embodiments, be deeper/taller than the deepest/tallest microstructure and should include some safety considering some possible warping of the polymer parts—for example, taller or deeper by a margin of (say) 10 μm to 100 μm.

The width of the anchor structures needs to be sufficient that the master can cope with the shear force without deformation of the anchor structures. Therefore the width is depending on the master material, example for nickel an aspect ratio (height:width)<1 may be used.

The shape of these anchor structures can be various for example deep and wide channel/wall around microstructures (like a frame), several/many blind hole structures/pillars in non-functional area, grid structure in non-functional area around the microstructures.

In order to minimize the movement of the polymer part during demoulding the anchor structures should not have a draft angle but parallel walls (a very slight undercut may be allowed provided that this slight undercut does not cause demoulding problems of the anchor structures).

As a further possible refinement, another idea is to include the ejector pins at positions (such as at the centre) defined with respect to such anchor structures. If so, in at least some arrangements no additional substrate space is lost and also ejector marks are located in non-critical areas.

These various embodiments and techniques will be discussed below. It will be appreciated that a particular device, as an embodiment of the present technology, could make use of more than one of these techniques.

Figure 4:
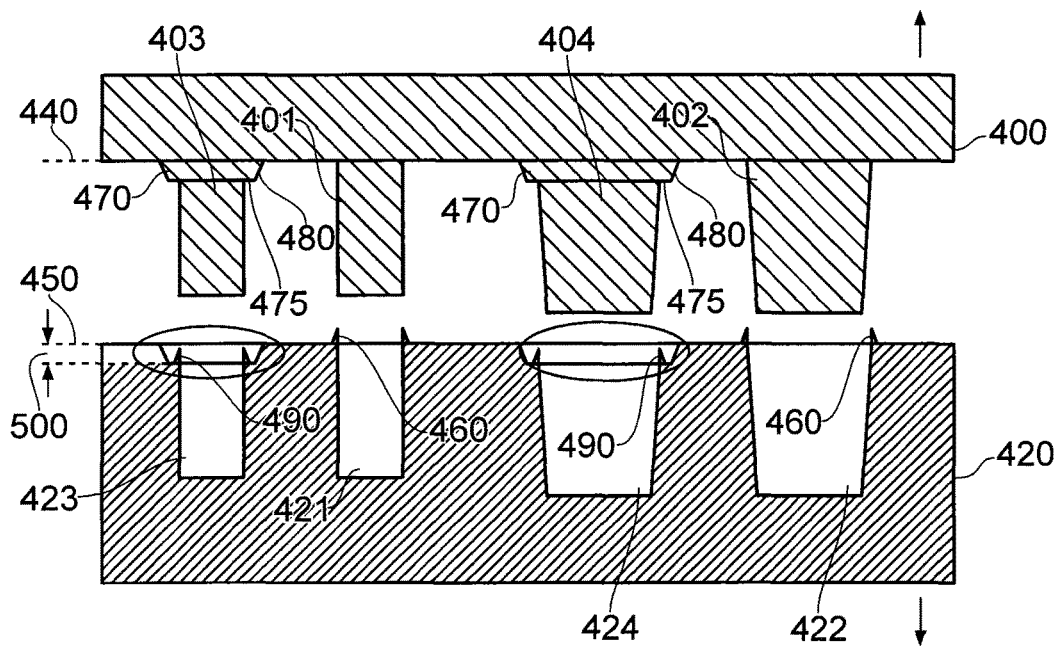
FIGS. 4 and 5 schematically illustrate the production of structural formations on a substrate.
Figure 5:
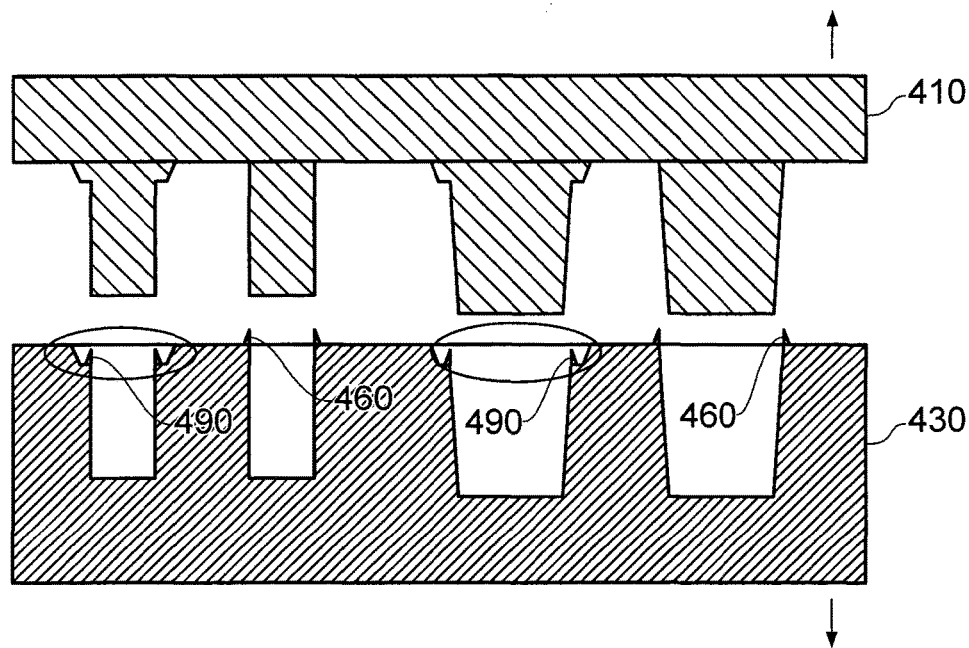

FIGS. 4 and 5 schematically illustrate the production of structural formations on a substrate.

In FIGS. 4 and 5, an upper portion 400, 410 of each drawing represents a portion of a master, for example a metal master fabricated by the steps described in relation to FIG. 3 above. A lower portion 420, 430 of each drawing represents a portion of a substrate fabricated using the respective portion 400, 410 of the master. The particular stage in processing illustrated in FIGS. 4 and 5 corresponds to the step 350 of FIG. 3. In other words, the finished substrate has just been released from the mould or master. In the context of FIGS. 4 and 5, the substrate and master have just been separated in a vertical direction as drawn.

Referring first to FIG. 4, there are four structural features illustrated. Two of these 401, 402 do not make use of the present techniques and are provided for illustration of a problem which can occur. The other two 403, 404 make use of the present techniques.

In detail, the master formation 401 has a zero draft angle and so, in other words, has sides which are perpendicular to the plane 440 of the master (corresponding to the plane 450 of the surface of the substrate). The master formation 402 has a non-zero draft angle, which is to say that its sides are not perpendicular to the plane 440 of the master, but instead the formation 402 is slightly chamfered. In other words, the formation 402 is smaller (narrower) at a distal end of the formation than at a proximal end, with respect to the master 400.

The substrate formations 421, 422 provided by the master formations 401, 402 respectively generally follow the shape of the corresponding master formation. In particular, the substrate formation 421 has sides which are perpendicular to the plane 450 of the substrate, whereas the substrate formation 422 is narrower at its deepest portion and wider at its top or open end.

On or after the release of the moulded substrate 420 from the master 400, so-called burrs 460 are formed at the edges of the moulded formations 421, 422 in the substrate 420. There can be various causes of these burrs, but one example cause is thermal or other shrinkage of the substrate after the moulding process has completed. In empirical tests it has been noted that such burrs can be formed even in instances such as the formation 422, which is to say even if a chamfered (non-zero draft angle) formation is provided.

It can be seen from the schematic representation in FIG. 4 that the burrs 460 stand proud of the plane 450 of the substrate.

The burrs can cause problems when the substrate is bonded to another part, for example another substrate or a foil part. It is noted that during any of the bonding processes discussed above, the surface to be bonded is first softened, and so in the present example the burrs would be softened and so the effect on the bonding is not necessarily as dramatic as would be the case if the burr formations were to remain rigid. However, even where the burr material has been so softened, it still represents additional material which comes between the two surfaces to be bonded, and can lead to poor bonding performance in regions adjacent to the burrs.

These problems are addressed by example master formations 403, 404, which, when processed as discussed above, give rise to corresponding substrate formations 423, 424 having an outer rim shallower than the fluid-carrying formation but below the surface of the substrate.

Accordingly, a master 400 having such formations can provide an example of master die for moulding a substrate for use in a microfluidic device so that a surface of the moulded substrate includes one or more microstructured formations complementary to respective moulding formations on the die, the fluid-carrying formations forming at least part of a microfluidic channel network comprising a plurality of microfluidic channels, in which the master die comprises one or more of the moulding formations having outer stepped formations so that the respective complementary microstructured formations on the moulded substrate include an outer rim shallower than the microstructured formation but below the surface of the substrate.

A polymer part as shown in FIG. 4 can provide an example of a substrate for use in a microfluidic device, in which a surface of the moulded substrate includes one or more fluid-carrying formations, the microstructured formations forming at least part of a microfluidic channel network comprising a plurality of microfluidic channels, in which one or more of the microstructured formations on the moulded substrate include an outer rim shallower than the microstructured formation, the rim not being in the plane of the substrate. It can also provide an example of a substrate for use in a microfluidic device, the substrate having at least one microstructured formation having an outer rim, the depth of the outer rim being shallower than that of the microstructured formation.

As before, the master formation 403 has a zero draft angle (perpendicular sides) and the master formation 404 is generally chamfered. However, in each case, a stepped formation 470 is provided at a proximal end of the respective master formation.

The stepped formation comprises a portion 475 which is parallel to the plane 440 of the master, and a further portion 480 which, in this example, is chamfered.

In general terms, corresponding formations are generated at the top edge (that is to say, the edge nearest the plane 450 of the substrate) of the moulded substrate 420. However, a significant difference (with respect to the formations not having the stepped formation 470) is that any burrs 490 are formed on the stepped formation rather than at the surface of the substrate 420.

In particular, the burrs 490 formed on that part of the moulded substrate which corresponds to the portion 475 of the master.

This means that the burrs are effectively countersunk to a position below the plane 450 of the surface of the substrate 420. If the depth 500 of the moulded portion of the substrate 420 corresponding to the portion 475 is greater than the height of the burrs, then the burrs will not affect the substrate-to-substrate bonding performance because they will not protrude above the plane 450 of the surface of the substrate 420. On the other hand there is the chance that there is a hollow space "behind" the burr which is connected to the microfluidic channel, which could in turn cause problems such as bubble trapping. Alternatively, if the depth 500 is less than the height of the burrs then the negative effect of the burrs on the bonding performance is at least reduced. In some cases where bubble trapping is critical it may be preferred that the depth 500 is less than the height of the burrs because in this case the cross section of the microfluidic channel remains almost unchanged during bonding. In embodiments of the present technology, the depth 500 is selected so as to be at slightly smaller than the height of a typical burr. An example depth is a few µm such as 1 µm-10 µm for small structures (height below 100 µm) or 10 µm-100 µm for large structures (height of the order of 1 mm; for example for through holes). So an example depth range is 1 µm-100 µm, or in some embodiments 1 µm-10 µm. For non-fluidic structures such as through-holes or anchor structures the depth 500 is selected so as to be at least as large as the height of a typical burr.

The examples shown in FIG. 4 relate to the formation of holes or wells in the substrate surface, as indicated by the fact that the stepped formation 470 is shown as being present around the whole periphery (or at least, all of the periphery that is shown in FIG. 4) of the respective master formation. However, the present techniques are also applicable to the formation of channels in the substrate, and, for completeness, such an arrangement is shown schematically in FIG. 5. Here, the drawing represents a cross-section through the substrate which is, for example, perpendicular to the direction of the channels, so that the master formations shown on the master 410 represent cross sections through longitudinal channel formations which extend perpendicular to the plane of the page. The techniques are the same as those shown in FIG. 4, except that the stepped formation is applied to the longitudinal edges of the respective channel formations (that is to say, the left and right edges as shown schematically in the cross-section of FIG. 5).

It will be appreciated that various different forms are possible for the stepped formation 470 or its equivalent. FIGS. 6a to 66 and FIGS. 7a to 7d schematically illustrate various options for master formations using the present techniques. In particular, FIGS. 6a to 6d schematically illustrate options relating to a perpendicular-sided master formation, whereas FIGS. 7a to 7d schematically illustrate corresponding options relating to chamfered master formations. In each of the drawings, it is assumed that the top of each formation is aligned with the plane 440 of the respective master.

Figures 6A, 6B, 6C, 6D:
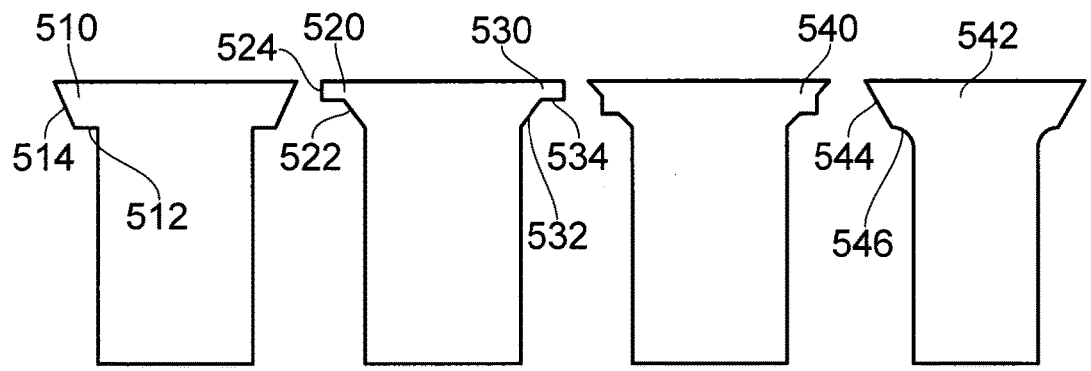
FIGS. 6a to 6d and FIGS. 7a to 7d schematically illustrate master formations.

Referring to FIG. 6a, an arrangement similar to that shown in FIG. 4 is provided, in which a stepped formation 510 comprises a portion 512 parallel to the plane of the master and a chamfered portion 514. The master formation of FIG. 6a has symmetrical stepped formations at either side.

In FIG. 6b, a possibility is illustrated in which the master formation does not have symmetrical stepped formations. To the left side of the master formation of FIG. 6b is a step formation 520 having a gently chamfered portion 522 and a perpendicular (or alternatively chamfered) portion 524. Here, the term "gently chamfered" is used to refer to a portion which is not parallel to the plane of the master but is within, say, 20° of being parallel to that plane. More generally, the chamfered portion is big enough that the elevated structure in the master which creates a corresponding recessed structure in the moulded part will not extend as far as the plane of the moulded part so that it does not cause a burr or deformation of that plane. To the right side of the master formation of FIG. 6b there is provided a step formation 530 having a chamfered portion 532 and then, nearer to the plane of the master, a portion 534 parallel to the plane of the master. Note that the formations are still referred to as "stepped" even if they do not include a portion which is exactly parallel to the plane of the master.

In FIG. 6c there is provided a more complicated stepped formation 540 having respective chamfered, parallel, perpendicular and chamfered portions.

Figures 7A, 7B, 7C, 7D:
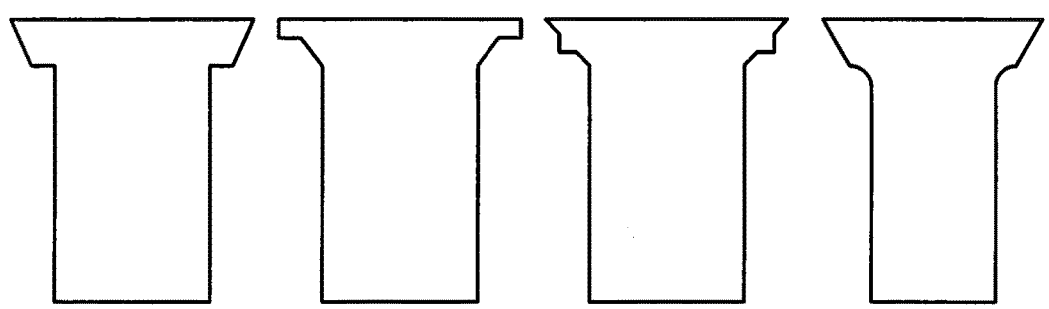

As mentioned, the arrangements of FIGS. 7a to 7c correspond to those of FIGS. 6a to 6c, but in the context of a chamfered main formation, for example one in which one or more of the moulding formations on the master die are chamfered so as to be narrower at a distal end than at a proximal end.

In FIG. 6d a formation 542 having a chamfered portion 544 and a curved portion 546 is provided. Note that although the above discussion relates to protrusions on the master generating holes or channels in the substrate, corresponding features and in particular stepped formations may be used in the case where indentations on the master lead to the generation of protrusions on the substrate.

Figure 8:
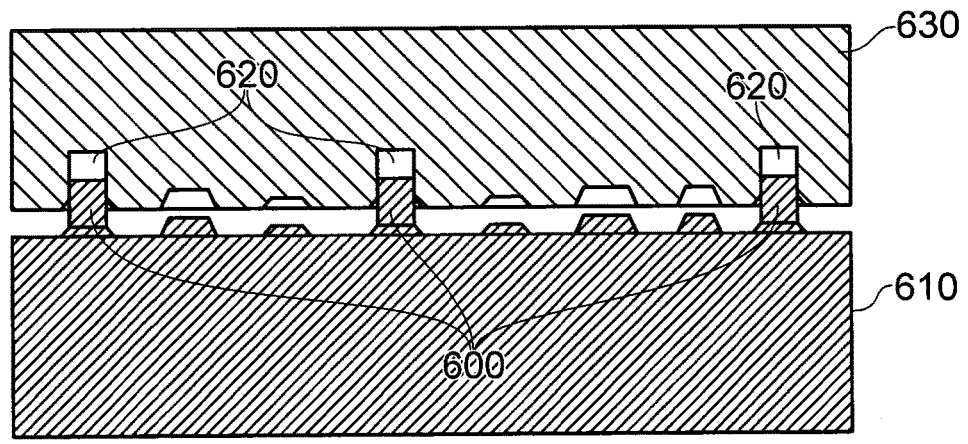
FIG. 8 schematically illustrates anchor structures formed on a polymer part.

In general terms the formations have a rim as discussed above. In some embodiments, at least a portion of the outer rim is substantially parallel to the plane of the substrate surface. A further technique which can be used to reduce the effect of polymer shrinkage on the generation of burrs or other deviations from a desired substrate shape is to provide so-called anchor structures. FIG. 8 schematically illustrates anchor structures 600 formed on a polymer part or substrate 610 by means of corresponding formations 620 in a master 630.

A master having such an anchor structure (whether protruding or recessed) can provide an example of a master die for moulding a substrate for use in a microfluidic device so that a surface of the moulded substrate includes one or more microstructured formations complementary to respective moulding formations on the die, the microstructured formations forming at least part of a microfluidic channel network comprising a plurality of microfluidic channels, in which the master die comprises one or more anchor formations having a greater height or depth than the maximum height or depth of the one or more moulding formations.

Figure 9:
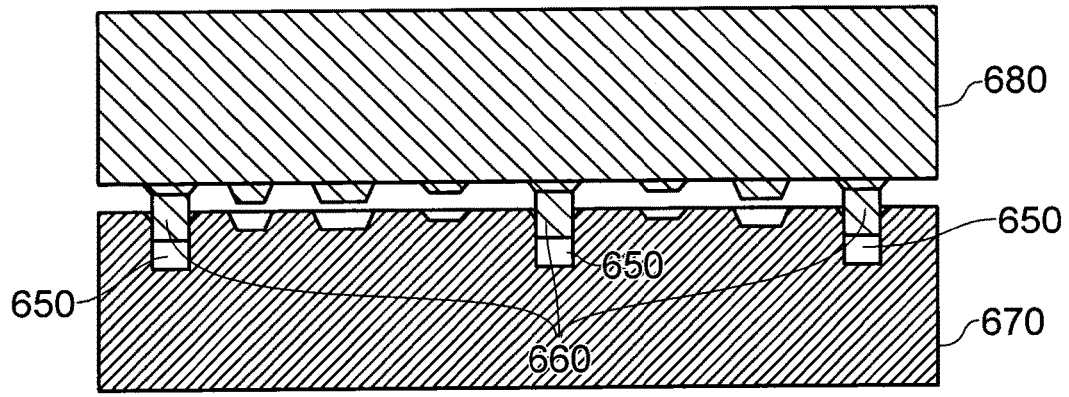
FIG. 9 schematically illustrates anchor structures formed as impressions in a polymer part.

FIG. 9 shows corresponding technical features, including anchor formations 650 formed in a substrate 670 by means of corresponding protrusions 660 in a master 680. Note that although the recessed formations 650 are referred to here as "anchor formations", the recesses in the moulded part and the protrusions on the master 680 share the same overall function, which is to allow the high shear stress caused by shrinkage to be directed towards the location of the anchor formations.

Since the stress is higher at the base of the anchor structures, which is to say, the portion nearest to the plane of the moulded part, in some embodiments the base portion of the anchor structure can be strengthened. In the case of an anchor structure which is recessed in the moulded part, the corresponding master protrusion can be increased in size. In the case of a protruding anchor structure on the moulded part, the protrusion can be made wider at its base.

Note that anchor structures which are recessed in the moulded part are considered to be more advantageous in terms of the subsequent bonding of the moulded part to another part.

Note that in each of the situation shown in FIGS. 8 and 9, the process stage corresponds to partway through the step 350, which is to say that the moulded substrate is just being removed from the master.

The so-called anchor structures absorb most of the lateral shrinking force to reduce lateral forces at the microstructures. Such anchor structures can be located between functional microstructures and/or around the micro-structured area.

In embodiments of the present technology the height of the anchor structures is larger than the height of the microstructures so that the anchor structures are de-moulded later than the micro-structures (in other words, as the master and the moulded substrate are withdrawn from one another, the anchor formations are among the last formations to finally be released from the mould.

In embodiments of the present technology the anchor structures have no draft angle (that is to say, their sides are perpendicular to the plane of the master and the plane of the substrate) or even a slight "negative draft angle" (undercut) so that the lateral movement is limited when the master is separated from the polymer part.

Note that, as shown schematically in FIGS. 8 and 9, the stepped formation technique discussed earlier can be combined with the use of anchor formations or structures.

Figure 10:
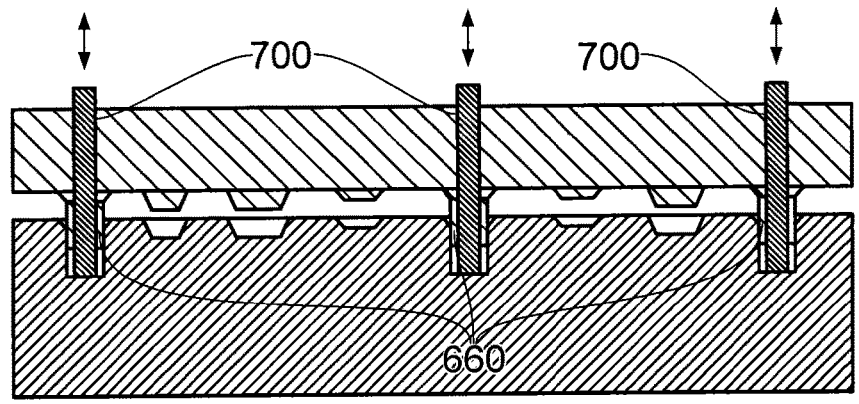
FIG. 10 schematically illustrates a set of ejection pins.

FIG. 10 schematically illustrates a set of ejection pins 700.

Ejection pins 700 are used to help release the moulded substrate from the master, by providing a releasing force (pushing the substrate and master apart) at spaced apart positions within the substrate. The use of such ejection pins (movable so as to drive the master die and the moulded substrate apart) avoids the need to apply excessive bending forces to the substrate as it is removed. However, in normal use, the space occupied by the ejection pins is useless for other microstructural features.

Accordingly, in the arrangement shown in FIG. 10, the ejection pins 700 are at positions associated with the positions of the anchor formations, for example being co-located with (for example, within, for example, centrally within) the anchor formations. Note that this can apply whether the anchor formations are positive protrusions (with respect to this substrate) such as those shown in FIG. 8, or negative indentations (with respect to the substrate) such as those shown in FIG. 9. In some embodiments, the ejection pins can be provided at the centre of respective anchor formations. In other embodiments, particularly where the anchor formations are somewhat larger than the ejection pins, and off-centre position may be used. In other embodiments, a position adjacent to a respective anchor formation may be used. Note that the number of anchor formations and the number of ejection pins may be different for a particular substrate. Accordingly, not all anchor formations need to have a respective ejection pin, and not all ejection pins need to be co-located with an anchor formation, in order to represent embodiments of the present technology.

Figure 11:
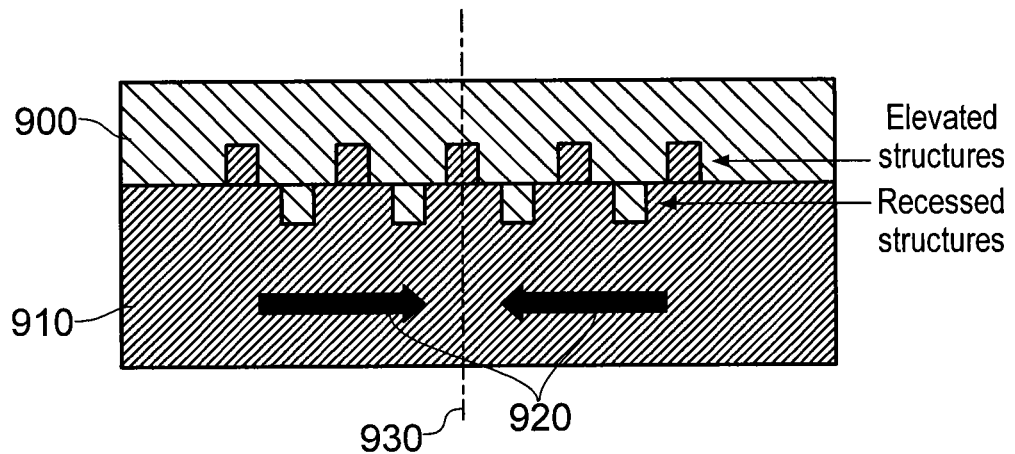
FIGS. 11 and 12 schematically illustrate a shrinkage process.
Figure 12:
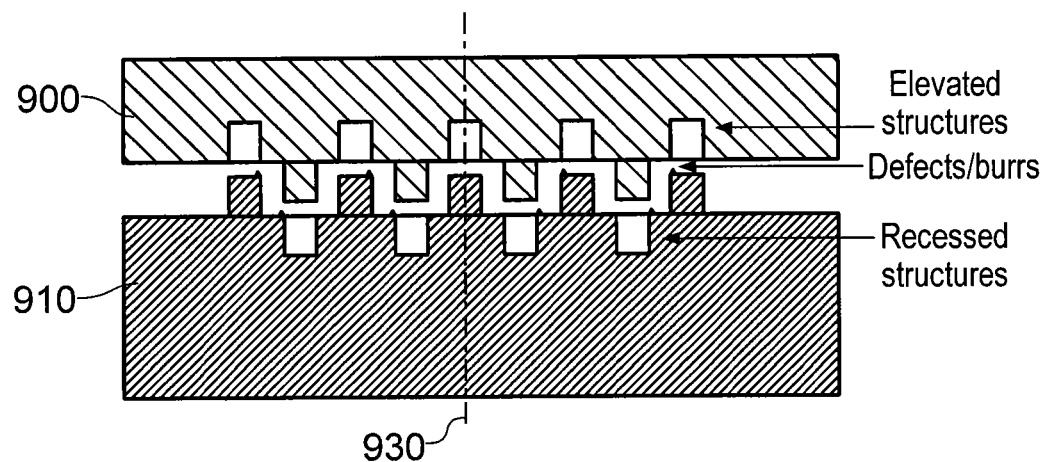

FIGS. 11 and 12 schematically illustrate the centre of shrinkage discussed earlier. In particular, the two Figures schematically show a master die 900 and a polymer part 910, both before (FIG. 11) and after (FIG. 12) separation. Shrinkage forces occur in a direction 920 generally illustrated in FIG. 11 around a centre of shrinkage 930. The shrinkage forces can, as discussed above, lead to the formation of burrs on the inside edges (with respect to the centre of shrinkage) of elevated structures of the polymer part and formation of burrs on the outside edges of recessed structures.

Figure 13:
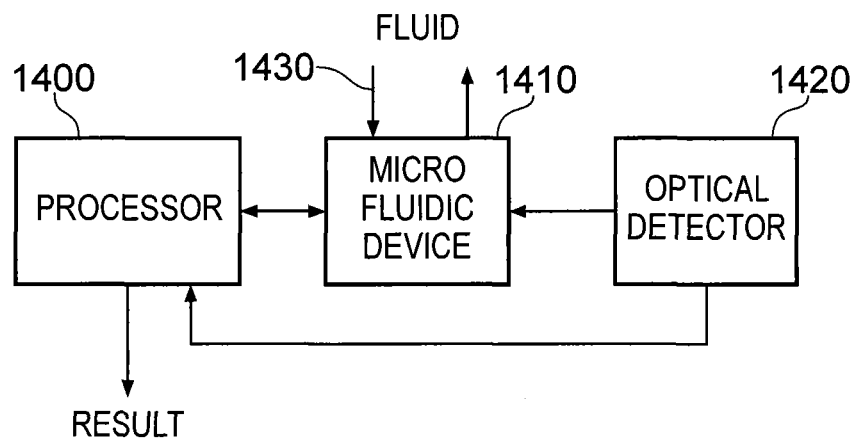
FIG. 13 schematically illustrates a microfluidic apparatus.

For some applications, a microfluidic device is incorporated into an instrument such as a fluid testing instrument. An example instrument is shown schematically in FIG. 13, comprising a processor 1400, a microfluidic device 1410 as described in the present specification and an optical detector 1420. The processor 1400 is configured to detect fluid measurement results from the microfluidic device by controlling the microfluidic device and to interpret its output as an output result. The microfluidic device performs a fluid test or detection on an input fluid 1430. The (optional) optical detector 1420 can assist in this process by detecting the movement of fluids within the microfluidic device.

Figure 14:
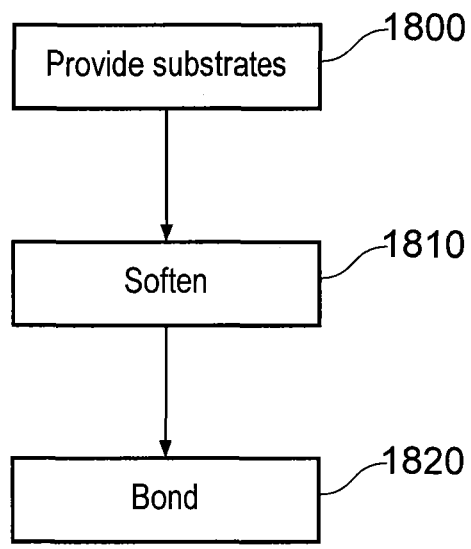
FIG. 14 is a schematic flowchart describing a bonding process.

FIG. 14 is a schematic flowchart describing a bonding process involved in a method of manufacturing a microfluidic device.

A step 1800 comprises providing first and second substrates made of respective first and second polymer materials, the first and second substrates having respective bonding surfaces, at least one of the bonding surfaces having open formations so that, when the bonding surfaces are bonded by surface deformation to one another, the bonded first and second substrates and the open formations form at least part of a microfluidic channel network comprising a plurality of microfluidic channels, in which bonding formations, separate to the channel formations defining the microfluidic channel network, are formed in at least one of the bonding surfaces.

A step 1810 comprises softening at least one of the bonding surfaces in preparation for bonding to each other. For example, the softening can be heating (in which case thermal bonding is used) or by exposure to a solvent vapour (so that solvent vapour bonding is used), or a combination of the two (in the case of solvent activated thermal bonding).

A step 1820 comprises bonding by compression the bonding surfaces of the first and second substrate.

FIGS. 15*a*, 15*b*, 16*a*, 16*b*, 17*a* and 17*b* schematically illustrate the effect of burrs on the bonding process. They are all cross-sectional drawings of a channel which is to be covered by a substrate, although similar considerations could apply to other formations shown in cross-section, such as a hole.

In particular, FIGS. 15*a* and 15*b* schematically illustrate the way in which a burr 1900 at the edge of a channel 1910 (not having a stepped formation) is deformed when a further substrate or cover is bonded over the channel. As can be seen in FIG. 15*b*, the burr material is squeezed into the channel so that the channel cross-section is compromised (as shown by a region 1930).

FIGS. 16*a*, 16*b*, 17*a* and 17*b* relate to channels 1940 having a stepped formation 1950.

In FIG. 16*a*, the burr height is smaller than the depth of the stepped formation so that the burr does not protrude from the channel. In FIG. 16*b*, when the substrate 1920 is bonded, the burr does not reach the substrate, so that a small hollow space 1960 is formed behind the burr, the hollow space being in fluid communication with the channel.

In FIG. 17*a*, the burr is taller than the depth of the stepped formation so that it protrudes above the plane of the base substrate. Now (in FIG. 17*b*) when the substrate 1920 is bonded, the burr material is compressed but is not squeezed into the channel. So the channel cross section remains uncompromised. There might be a hollow space behind the burr but this is not in fluid communication with the channel.

Embodiments of the present technology can include a substrate for a microfluidic device, the substrate being moulded according to any of the techniques described above; a microfluidic device comprising one or more such substrates; and/or a measurement instrument comprising such a microfluidic device and a processor configured to detect fluid measurement results from the microfluidic device.

The various embodiments (the outer rim formations and the anchor formations) may be combined in a single master die and/or substrate (polymer part).

Various features and at least some embodiments are defined by the following numbered clauses:

1. A method of manufacturing a microfluidic device, the method comprising:
   moulding a substrate using a master die having at least one outer stepped formation; and forming at least one microstructured formation having an outer rim, the depth of the outer rim being shallower than that of the microstructured formation.
2. A method according to clause 1, in which the moulding step comprises moulding the substrate using a master die so that a surface of the substrate includes one or more microstructured formations complementary to respective moulding formations on the die, the microstructured formations including a microfluidic channel and forming at least part of a microfluidic channel network comprising a plurality of microfluidic channels,
   in which one or more of the moulding formations on the master die comprise the outer stepped formation so that the respective complementary microstructured formations on the substrate include the outer rim shallower than the microstructured formation, the rim not being in the plane of the substrate.
3. A method according to clause 1 or clause 2, in which at least a portion of the outer rim is substantially parallel to the plane of the substrate surface.
4. A method according to any one of clauses 1 to 3, in which the outer rim has a depth of 1 µm-100 µm.
5. A method according to clause 4, in which the outer rim has a depth of 1 µm-10 µm.
6. A method according to clause 2, in which one or more of the moulding formations on the master die are chamfered so as to be narrower at a distal end than at a proximal end.
7. A method according to clause 2 or clause 6, in which the master die comprises one or more anchor formations having a greater height or depth than the maximum height or depth of the one or more moulding formations.
8. A method according to clause 7, comprising the step of providing one or more ejection pins, movable so as to drive the master die and the moulded substrate apart, at positions associated with the positions of the anchor formations.
9. A method according to clause 8, in which one or more ejection pins are disposed within respective anchor formations.
10. A method according to clause 8 or clause 9, in which the one or more ejection pins are disposed centrally within respective anchor formations.
11. A method of manufacturing a microfluidic device, the method comprising:
    moulding a substrate using a master die so that a surface of the substrate includes one or more microstructured formations complementary to respective moulding formations on the die, the microstructured formations forming at least part of a microfluidic channel network comprising a plurality of microfluidic channels,
    in which the master die comprises one or more anchor formations having a greater height or depth than the maximum height or depth of the one or more moulding formations.
12. A method according to clause 11, comprising the step of providing one or more ejection pins, movable so as to drive the master die and the moulded substrate apart, at positions associated with the positions of the anchor formations.
13. A method according to clause 11 or clause 12, in which one or more ejection pins are disposed within respective anchor formations.
14. A method according to any one of clauses 11 to 13, in which the one or more ejection pins are disposed centrally within respective anchor formations.
15. A master die having at least one outer stepped formation, for use in moulding a substrate by forming at least one microstructured formation having an outer rim, the depth of the outer rim being shallower than that of the microstructured formation.
16. A master die for moulding a substrate for use in a microfluidic device so that a surface of the moulded substrate includes one or more microstructured formations complementary to respective moulding formations on the die, the microstructured formations forming at least part of a microfluidic channel network comprising a plurality of microfluidic channels,
    in which the master die comprises one or more of the moulding formations having outer stepped formations so that the respective complementary microstructured formations on the moulded substrate include an outer rim shallower than the microstructured formation but below the surface of the substrate.
17. A master die for moulding a substrate for use in a microfluidic device so that a surface of the moulded substrate includes one or more microstructured formations complementary to respective moulding formations on the die, the microstructured formations forming at least part of a microfluidic channel network comprising a plurality of microfluidic channels,
    in which the master die comprises one or more anchor formations having a greater height or depth than the maximum height or depth of the one or more moulding formations.
18. A substrate for a microfluidic device, the substrate being moulded according to the method of any one of clauses 1 to 14.
19. A substrate for use in a microfluidic device, the substrate having at least one microstructured formation having an outer rim, the depth of the outer rim being shallower than that of the microstructured formation.
20. A substrate for use in a microfluidic device, in which a surface of the moulded substrate includes one or more microstructured formations, the microstructured formations forming at least part of a microfluidic channel network comprising a plurality of microfluidic channels, in which one or more of the microstructured formations on the moulded substrate include an outer rim shallower than the microstructured formation, the rim not being in the plane of the substrate.

21. A microfluidic device comprising one or more substrates according to clause 19 or clause 20.

22. A measurement instrument comprising:
   a microfluidic device according to clause 21; and
   a processor configured to detect fluid measurement results from the microfluidic device.

Obviously, numerous modifications and variations of the present disclosure are possible in light of the above teachings. It is therefore to be understood that within the scope of the appended claims, the disclosure may be practiced otherwise than as specifically described herein.

The present application claims priority to European Patent Application 13 182851.9, filed in the European Patent Office on Sep. 3, 2013, the entire contents of which being incorporated herein by reference.

The invention claimed is:

1. A method of manufacturing a microfluidic device, the method comprising:
   injection moulding a substrate using a master die having at least one outer stepped formation; and
   forming at least one microstructured formation having an outer rim, the depth of the outer rim being shallower than that of the microstructured formation;
   wherein the injection moulding step comprises moulding the substrate using a master die so that a surface of the substrate includes one or more microstructured formations complementary to respective moulding formations on the master die and one or more anchor formations complementary to respective anchor formations on the master die, the microstructured formations including a microfluidic channel and forming at least part of a microfluidic channel network comprising a plurality of microfluidic channels, in which one or more of the moulding formations on the master die comprise the outer stepped formation so that the respective complementary microstructured formations on the substrate include the outer rim shallower than the microstructured formation, the rim not being in the plane of the substrate; and
   wherein the master die comprises one or more respective anchor formations having a greater height or depth than the maximum height or depth of the one or more moulding formations; and
   wherein the one or more complementary anchor formations in the surface of the substrate are not fluidly connected to the microfluidic channel.

2. A method according to claim 1, in which at least a portion of the outer rim is substantially parallel to the plane of the substrate surface.

3. A method according to claim 1, in which the outer rim has a depth of 1 μm-100 μm.

4. A method according to claim 3, in which the outer rim has a depth of 1 μm-10 μm.

5. A method according to claim 1, in which one or more of the moulding formations on the master die are chamfered so as to be narrower at a distal end than at a proximal end.

6. A method according to claim 1, comprising the step of providing one or more ejection pins, movable so as to drive the master die and the moulded substrate apart, at positions associated with the positions of the anchor formations on the master die.

7. A method according to claim 6, in which one or more ejection pins are disposed within respective anchor formations on the master die.

8. A method according to claim 7, in which the one or more ejection pins are disposed centrally within respective anchor formations on the master die.

* * * * *